(12) United States Patent
Bal et al.

(10) Patent No.: US 11,921,537 B2
(45) Date of Patent: Mar. 5, 2024

(54) METHOD AND CIRCUIT FOR CALIBRATION OF HIGH-SPEED DATA INTERFACE

(71) Applicant: STMicroelectronics International N.V., Geneva (CH)

(72) Inventors: Ankur Bal, Greater Noida (IN); Jeet Narayan Tiwari, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/821,398

(22) Filed: Aug. 22, 2022

(65) Prior Publication Data
US 2023/0068753 A1 Mar. 2, 2023

Related U.S. Application Data

(60) Provisional application No. 63/238,681, filed on Aug. 30, 2021.

(51) Int. Cl.
| G06F 1/08 | (2006.01) |
|---|---|
| H03K 3/037 | (2006.01) |
| H03K 5/26 | (2006.01) |
| H03K 19/20 | (2006.01) |
| H03M 7/16 | (2006.01) |

(52) U.S. Cl.
CPC ............. *G06F 1/08* (2013.01); *H03K 3/037* (2013.01); *H03K 5/26* (2013.01); *H03K 19/20* (2013.01); *H03M 7/16* (2013.01)

(58) Field of Classification Search
None
See application file for complete search history.

(56) References Cited

U.S. PATENT DOCUMENTS

| 6,628,276 B1 | 9/2003 | Elliott |
| 8,749,420 B2 | 6/2014 | Takahashi et al. |
| 8,797,194 B2 | 8/2014 | Lin et al. |
| 2020/0057465 A1* | 2/2020 | Huang ................ H03L 7/07 |

FOREIGN PATENT DOCUMENTS

| EP | 0836768 B1 | 3/2003 |
| EP | 1940030 A2 | 7/2008 |

* cited by examiner

*Primary Examiner* — Cassandra F Cox
(74) *Attorney, Agent, or Firm* — Seed IP Law Group LLP

(57) ABSTRACT

An integrated circuit includes a first circuit block operating with a first clock signal and a second circuit block operating with a second clock signal. The first circuit block includes a clock phase generator that receives the first clock signal and outputs a plurality of phase signals. The first circuit block includes a phase selector that receives the phase signals and the second clock signal and selects one of the phase signals based on the second clock signal. The first circuit block transmits data to the second circuit block based on the selected phase signal.

23 Claims, 6 Drawing Sheets

METHOD AND CIRCUIT FOR CALIBRATION OF HIGH-SPEED DATA INTERFACE

BACKGROUND

Technical Field

The present disclosure is related to integrated circuits, and more particularly to integrated circuits including multiple circuits using different clock signals.

Description of the Related Art

A system on-chip (SoC) includes a plurality of subsystems implemented in a single integrated circuit. In some cases, one subsystem of the SoC is configured to provide data to the second subsystem of the SoC. It can be difficult to manage such communication efficiently.

In one example the first subsystem operates with a first clock signal and the second subsystem operates with a second clock signal. There are various complications that affect the timing of communication between the first and second subsystems. For example, the first and second clock signals may be out of phase with each other to an unknown degree. This unknown phase difference can make it difficult to reliably transmit data from the first subsystem in accordance with the first clock signal and to receive data at the second subsystem on a desired cycle of the second clock signal. If this is not managed properly, then there can be delays and even failures in data reception by the second subsystem.

BRIEF SUMMARY

Embodiments of the present disclosure provide an integrated circuit with circuit blocks or subsystems that can reliably communicate with each other regardless of phase mismatches in their clock signals. This is accomplished by generating a plurality of phase signals in a first circuit block or subsystem and determining which phase signal has a desirable phase offset with respect to the clock signal of a second circuit block or subsystem. After a desirable phase signal has been found for the first circuit block, that phase signal is utilized to coordinate transmission of data from the first circuit block to the second circuit block.

In one embodiment, a first circuit block transmits data to a second circuit block. The first circuit block generates a first clock signal. The second circuit block generates a second clock signal. The first circuit block generates a plurality of phase signals based on the first clock signal. The phase signals each correspond to the first clock signal but with respective phase differences. The first circuit block also receives the second clock signal. The first circuit block compares the plurality of phase signals to the second clock signal and selects a phase signal with a desirable phase difference relative to the second clock signal. The first circuit block then uses the selected phase signal to transmit data to the second circuit block.

In one embodiment, the first circuit block includes a multiplexer that receives all of the phase signals. The first circuit block includes a phase selector that receives the phase signals one at a time from the multiplexer. The phase selector includes a first flip-flop that receives the phase signal currently output by the multiplexer. The phase selector includes one or more second flip-flops in series with the first flip-flop and including clock input terminals that receive the second clock signal. For each received phase signal, the phase selector determines whether there is a set up failure in one of the second flip-flops. The phase selector selects one of the phase signals based on when the set up failure occurs.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
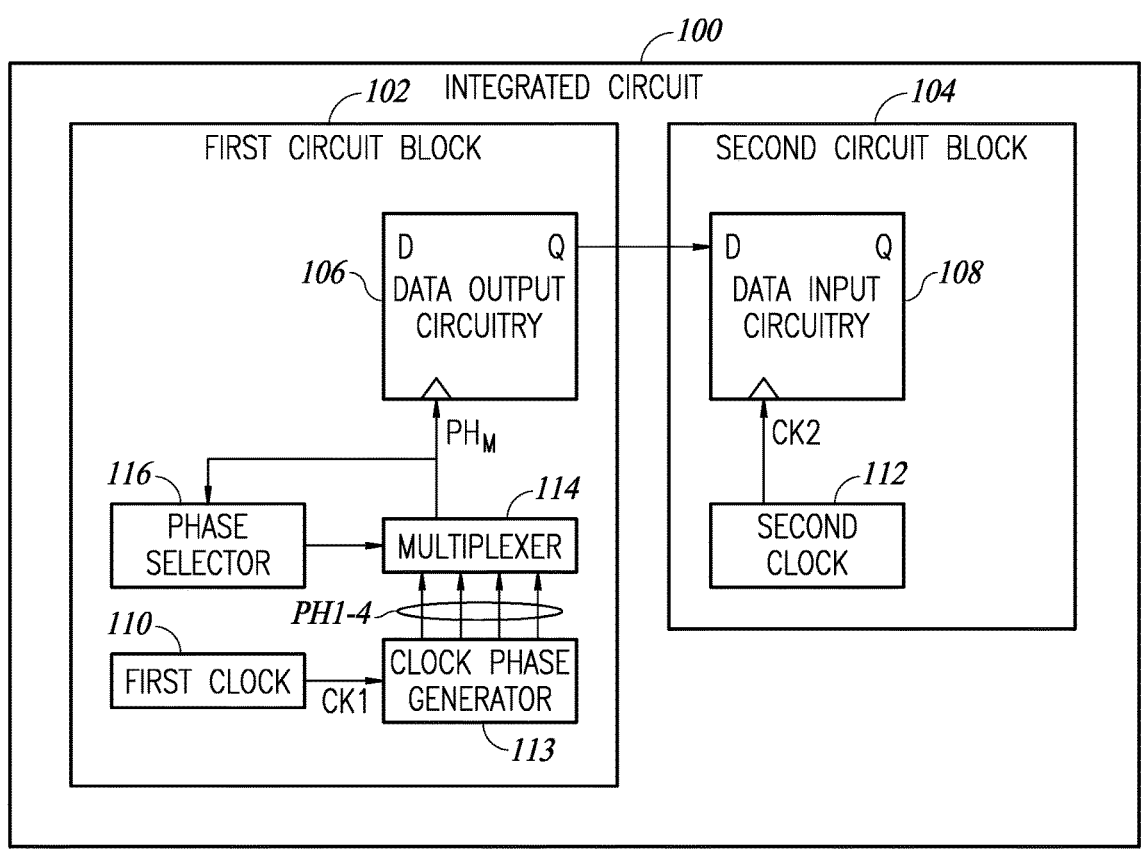
FIG. 1 is a block diagram of an integrated circuit, in accordance with some embodiments.

FIG. 1 is a block diagram of an integrated circuit 100, in accordance with some embodiments. The integrated circuit 100 includes a first circuit block 102 and a second circuit block 104. The first circuit block 102 includes a data output circuitry 106. The second circuit block 104 includes a data input circuitry 108. The data output circuitry 106 transmits data to the data input circuitry 108. As will be set forth in more detail below, components of the first circuit block 102 cooperate to ensure that the data output circuitry 106 transmits data to the data input circuitry 108 in a reliable manner.

The first circuit block 102 includes a first clock 110. The first clock 110 generates a first clock signal CK1. The first clock 110 can include a voltage control oscillator, a current control oscillator, a ring oscillator, or other types of oscillators that can generate a clock signal. The first clock 110 may generate a first clock signal CK1 from a global clock signal of the integrated circuit 100. In this case, the integrated circuit 100 may include a global clock generator, such as a crystal oscillator or other type of clock generator that generates the clock signal with a frequency on which the clock signals of the various circuit blocks are based. Accordingly, the first clock 110 may receive the global clock signal and generate CK1 based on the global clock signal. The first clock signal CK1 may have the same frequency as the global clock signal. The first clock signal CK1 may be the global clock signal.

The first clock signal CK1 is the clock signal on which the basic functions of the first circuit block 102 are performed. The block diagram of FIG. 1 only illustrates aspects of the first circuit block 102 that are related to transmission of data to the second circuit block 104. In practice, the first circuit block 102 includes other circuitry associated with a primary function of the first circuit block 102. In an example in which the first circuit block 102 is an analog circuit block of an analog-to-digital converter (ADC), the first circuit block 102 may include circuitry that converts analog signals to digital signals under control of the first clock signal. For simplicity, such circuitry is not shown in FIG. 1.

The second circuit block 104 includes a second clock 112. The second clock 112 generates a second clock signal CK2. The second clock 112 can include a voltage controlled oscillator, a current controlled oscillator, a ring oscillator, or other types of oscillators that can generate a clock signal. The second clock 112 may generate a second clock signal CK2 from the global clock signal of the integrated circuit 100 as described in relation to the generation of the first clock signal CK1. The second clock 112 may receive the global clock signal and generate CK2 based on the global clock signal. The second clock signal CK2 may have the same frequency as the global clock signal. The second clock signal CK2 may be the global clock signal.

In one embodiment, the first clock signal CK1 and the second clock signal CK2 have the same frequency. However, the first and second clock signals CK1 and CK2 are out of phase with each other. Initially, the phase difference between the first clock signal CK1 and the second clock signal CK2 may be unknown. The magnitude of the phase difference affects how data is transmitted from the first circuit block 102 and received by the second circuit block 104. If no action is taken based on the phase difference, then it is possible that clock cycles will be wasted between transmitting and receiving data due to delays associated with transmitting and receiving data. As will be set forth in more detail below, the first circuit block 102 address the phase difference between CK1 and CK2 and adjusts data transmission based on the phase difference.

The first circuit block 102 includes a clock phase generator 113. The clock phase generator 113 receives the first clock signal CK1 from the first clock 110. The clock phase generator 113 generates, from the first clock signal CK1, Phase signals P1-P4. The phase signals P1-P4 are also clock signals having a same frequency as the first clock signal CK1. While FIG. 1 illustrates four phase signals, in practice the clock phase generator 113 can generate more or fewer phase signals than four.

The clock phase generator 113 generates each phase signal having a selected phase difference relative to the first clock signal CK1. In an example in which there are four phase signals, the first phase signal P1 may have a phase difference of T/4 relative to the first clock signal CK1, where T is the period of the clock signal CK1 and the phase signals P1-P4. This means that the rising edge of P1 occurs T/4 after the rising edge of CK1. The second phase signal P2 may have a phase difference of T/4 relative to the first phase signal P1. The third phase signal P3 may have a phase difference of T/4 relative to the second phase signal P2. The fourth phase signal P4 may have a phase difference of T/4 relative to the third phase signal P4. In a more general sense, if there are N phase signals P1-PN, then each phase signal baby offset from the previous phase signal by T/N.

The clock phase generator 113 can include one or more phase locked loops (PLL) for generating phase signals P1-P4 from the first clock signal CK1. While the first clock 110 and the clock phase generator 113 are shown as distinct components, in practice, the first clock 110 and the clock phase generator 113 may be a single component. For example, the circuit that generates the first clock signal CK1 may also generate the phase signals P1-P4.

The first circuit block 102 includes data output circuitry 106. The data output circuitry 106 outputs data to the second circuit block 104. In an example in which the first circuit block is an ADC, the data output circuitry 106 receives the digital data converted from analog signals and provides the digital data to the second circuit block 104.

The data output circuitry 106 includes a plurality of logic circuits that receive data of the first circuit block 102 and output the data to the second circuit block 104. There is delay associated with the logic circuits of the data output circuitry 106.

In one example, the data output circuitry 106 includes flip-flops that each include a clock terminal, a data input terminal, and a data output terminal. The data received at the input terminal will typically be provided to the output terminal upon the next rising edge of the clock signal received at the input terminal. However, there is a setup delay associated with the flip-flop. When data arrives at the input terminal of the flip-flop, there is a small setup time for the data to be fully received by the input terminal. If the rising edge of the clock signal occurs after data has arrived at the input terminal, but before the set up time has elapsed, then that data will not be passed to the output terminal of the flip-flop until the next rising edge of the clock signal. Accordingly, the setup time associated with the data input terminal is a source of signal transmission delay. Furthermore, there is an additional delay associated with passing data from the input terminal to the output terminal after the rising edge of the clock signal.

The second circuit block 104 includes data input circuitry 108. The data input circuitry 108 receives data from the data output circuitry 106 of the first circuit block 102. The data input circuitry 108 also includes logic circuits that receive and process the data from the data output circuitry 106 of the first circuit block 102. There are delays associated with the logic circuits of the data input circuitry 108.

In one example, the logic circuits of the data input circuitry 108 include a plurality of flip-flops. As described previously in relation to flip-flops of the data output circuitry 106, there are delays associated with receiving data at input terminals of the flip-flops of the data input circuitry. In particular, the setup delay described previously is also a factor in the flip-flops of the data input circuitry 108. If the rising edge of the second clock signal is received at the clock terminal of the flip-flop after data arrives at the input terminal of the flip-flop but before the set up time associated with the data input terminal has elapsed, then the data value will not be passed to the flip-flop until the next rising edge of the clock signal. Accordingly, an entire clock signal can be lost if the clock signals that control the flip-flops of both the data output circuitry 106 and the data input circuitry 108 are not carefully managed.

Returning to the data output circuitry 106 of the first circuit block 102, data is provided to the data output circuitry 106 in accordance with a phase signal Pm. The phase signal Pm is whichever of the phase signals P1-P4 is selected for outputting data, as will be described in further detail below. Accordingly, data is passed from the data output circuitry 106 in accordance with the phase signal Pm.

However, the clock signal that is provided to the flip-flops of the data output circuitry 106 is the second clock signal CK2. Thus, data is passed from the output terminals of the flip-flops of the data output circuitry 106 based on the rising edge of the phase signal Pm, but data is processed at the data input terminals of the flip-flops of the data input circuitry 108 based on the rising edge of the second clock signal CK2. Due to the delays associated with the data output circuitry 106 and the data input circuitry 108 as described above, if the rising edge of the second clock signal CK2 occurs too close to the rising edge of the first clock signal CK1, the data will not be received and processed at the data input circuitry 108 within the same cycle of the second clock signal, assuming that the flip-flops of the data input circuitry 108 are managed by the rising edge of the second clock signal.

Advantageously, the first circuit block 102 includes a phase selector 116 to select one of the phase signals Pm for controlling the data output circuitry 106. The phase selector 116 receives the phase signals P1-P4 sequentially from the multiplexer 114. The multiplexer 114 outputs the phase signal P1 for a selected duration. The multiplexer 114 then outputs the phase signal P2 for a selected duration. The multiplexer 114 then outputs the phase signal P3 for a selected duration. The multiplexer 114 then outputs the phase signal P4 for a selected duration. Accordingly, the phase selector 116 receives each of the phase signals one after the other in a sequence. The sequence can be different than described above. The phase selector 116 also receives the second clock signal CK2.

The phase selector 116 effectively compares the phase signals P1-P4 to the second clock signal CK2 in order to determine which phase signal should be utilized for the data output circuitry 106. In one embodiment, the phase selector 116 selects the phase signal for which the largest amount of time elapses between the rising edge of the phase signal until the next rising edge of the second clock signal CK2. This long duration between the rising edges of the selected phase signal and the second clock signal may be selected because it is highly unlikely that the combined delays associated with the data output circuitry 106 and the data input circuitry 108 will be greater than the delay between rising edges. This helps ensure that data is properly received and processed at the data input circuitry 108 without missing any clock cycles.

The phase selector 116 can include a first flip-flop that receives the current phase signal Pm on its clock input terminal. The phase selector 116 can also include one or more second flip-flops connected in series with and downstream from the first flip-flop and that receive the second clock signal CK2 on their clock input terminals. The phase selector 116 passes a series of data values from the first flip-flop through the second flip-flops. For each phase signal, the phase selector 116 can determine if there is a set up failure at one of the second flip-flops downstream from the first flip-flop. If there is no set up failure for a phase signal, then the phase selector 116 compares the next phase signal to the second clock signal CK2. This process continues until a phase signal is found for which a failure set up occurs in one of the second flip-flops. This set up failure can be used as an indication as to which phase signal should be used for the data output circuitry 106.

The occurrence of a set up failure indicates that the rising edge of the phase signal occurs too soon before the rising edge of the second clock signal CK2. This may be an indication that the next phase signal will have a rising edge that occurs right after the rising edge of the second clock signal CK2, and therefore that there will be a long duration between the rising edge of the next phase signal and the next rising edge of the second clock signal CK2. Accordingly, the phase selector 116 may select, for the data output circuitry 106, the next phase signal after a set up failure. For example, if a set up failure occurs on the phase signal P3, and the phase selector 116 may select the phase signal P4.

The phase selector 116 may select the phase signal for which the set up failure has occurred. In this case, a small buffer or delay may be added ahead of the clock input terminal of the data output circuitry 106 to delay the rising edge of the selected phase signal enough to place the rising edge of the phase signal just after the rising edge of the second clock signal.

In some cases, depending on the number of phase signals or second flip-flops, there may be set failures for multiple phase signals. The phase selector 116 may select the final phase signal for which a set up failure occurs or may select the phase signal immediately succeeding the final phase signal for which a set up failure occurs. Accordingly, the phase selector 116 may continue comparing phase signals after a set up failure occurs to identify the final phase signal for which a set up failure will occur. The phase selector 116 can then selected phase based on the final phase signal for which the set up failure occurred. As used herein, the term "set up failure" can include a situation in which data is processed at a second flip-flop on the second rising edge (or second falling edge if the falling edge controls the flip-flop) of the second clock signal after transmission from a previous flip-flop.

The description above has primarily addressed an example in which rising edges control the data output circuitry 106 of the data input circuitry 108. However, the data output circuitry 106 and the data input circuitry 108 may be controlled by falling edges or by both rising edges and falling edges. The phase selector 116 can be configured to select a phase signal in any of these situations. Accordingly, principles of the present disclosure can be extended to various other situations without departing from the scope of the present disclosure.

After the phase selector 116 has selected a phase signal, the phase selector 116 sends a control signal to the multiplexer 114 causing the multiplexer 114 to perpetually output the selected phase signal to the data output circuitry 106. The phase selector 116 may also provide a control signal to the clock phase generator 113 causing the clock phase generator 113 to stop generating other phase signals.

Figure 2:
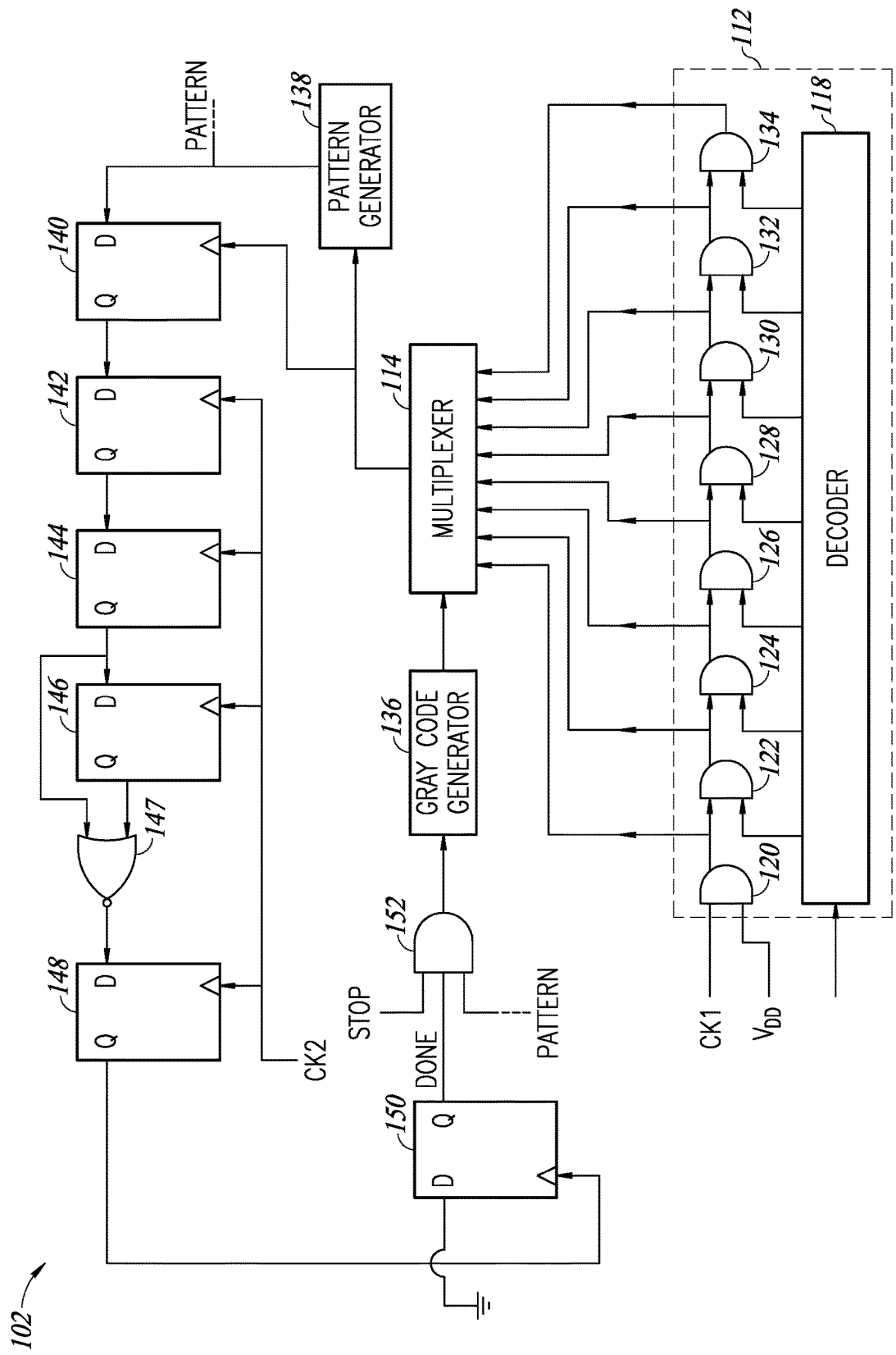
FIG. 2 is a schematic diagram of a first circuit block of an integrated circuit, in accordance with some embodiments.

FIG. 2 is a schematic diagram of a first circuit block 102 of the integrated circuit 100, in accordance with some embodiments. The first circuit block 102 is one example of a first circuit block 102 of FIG. 1. The first circuit block 102 includes a clock phase generator 113. The clock phase generator 113 includes a decoder 118 and a plurality of AND gates 120-134. In the example of FIG. 2, there are eight AND gates 120-134 connected in series. As is set forth in more detail below, the eight AND gates will collectively generate phase signals P1-P8.

The first AND gate 120 receives the first clock signal CK1 on a first input terminal and the supply voltage VDD on a second input terminal. The output of the first AND gate 120 is provided to the first input of the second AND gate 122. The AND gates 122-134 each receive a respective control signal from the decoder 118 on their respective second input terminals. The output terminal of the AND gate 122 is connected to the first input terminal of the AND gate 124. The output of the AND gate 124 is connected to the first input terminal of the AND gate 126. The output of the AND gate 126 is connected to the first input terminal of the AND gate 128. The output of the AND gate 128 is connected to the first input terminal of the AND gate 130. The output of the AND gate 130 is connected to the first input terminal of the AND gate 132. The output of the AND gate 132 is connected to the first input terminal of the AND gate 134.

During a calibration operation in which a phase signal is being selected, the decoder 118 provides a high value to the second input terminals of the AND gate 122-134. Each AND gate introduces a delay relative to the preceding AND gate. When the first clock signal goes high, the output of the first AND gate 120 goes high a short time later. The output of the second AND gate 122 goes high a short time after the output of the AND gate 120 goes high. This continues through the chain of AND gates. The result is that there is an incrementally larger delay between the rising edge of the first clock signal CK1 and the output of each successive AND gate. The outputs of each AND gate is a respective one of the phase signals P1-P8.

In one example, each AND gate introduces a phase delay of approximately T/8 relative to the output of the preceding AND gate. Accordingly, P1 has a delay of T/8 relative to the first clock signal CK1. The phase signal P2 has a delay of 2T/8 relative to the first clock signal CK1. The phase signal P3 has a delay of 3T/8 relative to the first clock signal, and so on for the subsequent phase signals P4-P8. The final phase signal P8 may be aligned with the first clock signal CK1. If there are N phase signals, then each phase signal may be delayed by T/N with respect to the preceding phase signal.

The first circuit block 102 includes a multiplexer 114. The multiplexer 114 receives all of the phase signals P1-P8. The multiplexer 114 outputs one of the phase signals at a time. The currently output phase signal is labeled Pm.

The first circuit block 102 also includes a gray code generator 136. The gray code generator 136 generates a gray code provides the gray code to control terminal of the multiplexer 114. The gray code is a value indicates which of the phase signals should be output by the multiplexer 114. In one example, the gray code begins with a binary value 000, causing the multiplexer 114 to output the phase signal P1. The gray code then changes to the binary value 001, causing the multiplexer 114 to output the phase signal P2. The gray code then changes to 010, causing the multiplexer 114 to output the phase signal P3. The gray code continues jumping upward in binary until the value 111 causes the multiplexer 114 to output the phase signal P8. Alternatively, the gray code generator 136 may stop before reaching 111 if a phase signal is selected before the gray code reaches that value. Accordingly, when the gray code is active the multiplexer 114 sequentially outputs the phase signals P1-P8.

The circuit block 102 includes a pattern generator 138. The pattern generator 138 is coupled to the output of the multiplexer 114. Accordingly, the pattern generator 138 receives the phase signal that is currently output from the multiplexer 114. The pattern generator 138 generates and outputs a pattern of data values in timing with the phase signal Pm. The pattern of data values can include alternating binary values of 0s and 1s. In one example, the pattern corresponds to the binary pattern 01010101 . . . , though other patterns can be utilized without departing from the scope of the present disclosure.

The circuit block 102 includes a flip-flop 140. The flip-flop 140 has a clock input terminal that receives the current phase signal Pm from the multiplexer 114. The flip-flop 140 has a data input terminal that receives the pattern of data values from the pattern generator 138.

The circuit block 102 includes the flip-flops 142, 144, and 146, all connected in series with the flip-flop 140. The flip-flops 142, 144, and 146 include clock input terminals that receive the second clock signal CK2. The data input of the flip-flop 142 is connected to the data output of the flip-flop 140. The data input of the flip-flop 144 is connected to the data output of the flip-flop 142. The data input of the flip-flop 146 is connected to the data output of the flip-flop 144.

The pattern of data values is passed from the flip-flop 140 through the flip-flops 142, 144, and 146. As set forth previously, the flip-flop 140 is controlled by the current phase signal Pm, while the flip-flops 142, 144, and 146 are controlled by the second clock signal. The flip-flop 140 passes data values from the data input to the data output upon the rising edge of the currently selected phase signal Pm. The flip-flops 142, 144, and 146 pass data values from their data inputs to their data outputs upon the rising edge of the second clock signal CK2.

If there are no setup failures in the chain of flip-flops 140-146, then the outputs of the flip-flops 144 and 146 will never be the same due to the alternating pattern of 0s and 1s in the pattern generated by pattern generator 138 as described previously. Each of the flip-flops 140-146 has a setup delay, as described previously. If data arrives at the input terminal of any of the flip-flops 142-146 within the set up window prior to the next rising edge of the second clock signal, then that data value will not be passed to the output of that flip-flop on the rising edge of the second clock signal, and will instead be passed to the output a full clock cycle later. If this occurs within the flip-flops 142, 144 146, then there will be a clock cycle for which the outputs of the flip-flops 144 and 146 will be the same. This indicates a set up failure due to the rising edge of the phase signal Pm being too close before the rising edge of the second clock signal CLK2.

In order to detect such as set up failure, the circuit block 102 includes an XNOR gate 147. A first input of the XNOR gate is coupled to the output of the flip-flop 144. A second input of the XNOR gate is coupled to the output of the flip-flop 146. The output of the XNOR gate will be 0 if the outputs of the flip-flops 144 and 146 are different from each other. The output of the XNOR gate will be 1 if the outputs of the flip-flops 144 and 146 are the same as each other. Because the pattern generator generates a pattern of alternating 0s and 1s (010101 . . . ), the outputs of the flip-flops 144 and 146 will only be the same if there is a set up failure somewhere in the chain of flip-flops 142-146. Accordingly, the output of the XNOR gate 147 indicates whether there has been a set up failure. If the output of the XNOR gate is low, no set up failure has occurred. If the output of the XNOR gate 147 is high, then a setup failure has occurred.

The circuit block 102 includes a flip-flop 148 downstream from the XNOR gate 147. The clock input terminal of the flip-flop 148 receives the second clock signal CK2. The data input terminal of the flip-flop 148 is connected to the output of the XNOR gate 147. The circuit block 102 also includes a flip-flop 150 having a clock input terminal coupled to the data output terminal of the flip-flop 148 and a data input terminal coupled to ground. When a set up failure occurs for the current phase signal Pm, then the output of the flip-flop 148 will go high. When the output of the flip-flop 148 goes high, the value of ground is passed from the data input terminal of the flip-flop 150 to the data output terminal of the flip-flop 150. The circuit block 102 includes an AND gate 152 having a first input receiving a signal STOP, a second input coupled to the data output terminal of the flip-flop 150, a third input that receives the pattern signal from the pattern generator 138, and an output coupled to the gray code generator 136.

The AND gate 152 controls the function of the gray code generator 136. Each time the output of the AND gate goes from low to high, the gray code generator 136 switches to the next value, causing the multiplexer 114 to switch to the next phase signal. The signal STOP is high while phase selection is ongoing. The output of the flip-flop 150 is also high while phase selection is ongoing. The pattern from the pattern generator 138 alternates between 0 and numeral 1 on each clock cycle of the current phase signal. Accordingly, the output of the AND gate 152 switches on every cycle of the current phase signal, thereby causing the gray code generator 136 to also switch to the next code on every cycle, thereby causing the multiplexer 114 to switch to the next phase signal after every full clock cycle. Accordingly, as long as there is no setup failure, then the multiplexer 114 will continue to cycle through the phase signals.

Once a set up failure occurs, the output of the flip-flop 150 goes low, causing the output of the AND gate 152 to remain low, causing the gray code generator 136 to stop at the current code value, causing the multiplexer 114 to stop at the current phase signal Pm. This corresponds to selection of the current phase signal Pm.

In one example, the gray code generator 136 initially outputs the code 000, causing the multiplexer 114 to provide the phase signal P1. No setup failure occurs with the phase signal P1. The gray code generator 136 then outputs the code 001, causing the multiplexer 114 to output the phase signal P2. No setup failure occurs with the phase signal P2. The gray code generator 136 then outputs the code 010, causing the multiplexer 114 to output the phase signal P3. No setup failure occurs with the phase signal P3. The gray code generator 136 then outputs the code 011, causing the multiplexer 114 to output the phase signal P4. A set up failure occurs with the phase signal P4. This causes the output of the flip-flop 148 to go high, thereby causing the output of the flip-flop 150 to go low, thereby causing the output of the AND gate 152 to go low, thereby causing the gray code generator 136 to stop at the current code value.

Continuing with the example, because the phase signal P4 causes a set up failure, the phase signal P5 may be selected for controlling output of data from the first circuit block 102 to the second circuit block 104. P5 may be selected because the rising edge of P4 is so soon before the rising edge of the second clock signal CK2, that the rising edge of the phase signal P5 will occur immediately after the rising edge of the clock signal CK2. Accordingly, nearly an entire clock cycle will occur after the rising edge of the phase signal P5 before the next rising edge of the second clock signal CK2. Alternatively, the phase signal P6 are P7 may be selected if failure occurs with the phase signal P4. In yet another embodiment, the phase signal P4 is selected and passed through a delay element prior to reaching the data output circuitry 106 to ensure that, after the delay, the rising edge of the phase signal P4 occurs very soon after the rising edge of the second clock signal CK2.

In some embodiments, after a phase signal has been selected, the decoder 118 outputs a code that causes the outputs of some of the AND gates 120-134 to go low. For example, if the phase signal P5 is selected, then the decoder 118 will output high values that cause the AND gates 122-128 to continue generating the phase signals P1-P5. The decoder 118 will output low values to the AND gates 130-134, causing them to stop generating the phase signals P6-P8. This can help reduce power consumption after the process of selecting a phase signal.

Various other configurations can be utilized to selected phase signal in accordance with principles of the present disclosure without departing from the scope of the present disclosure.

Figure 3:
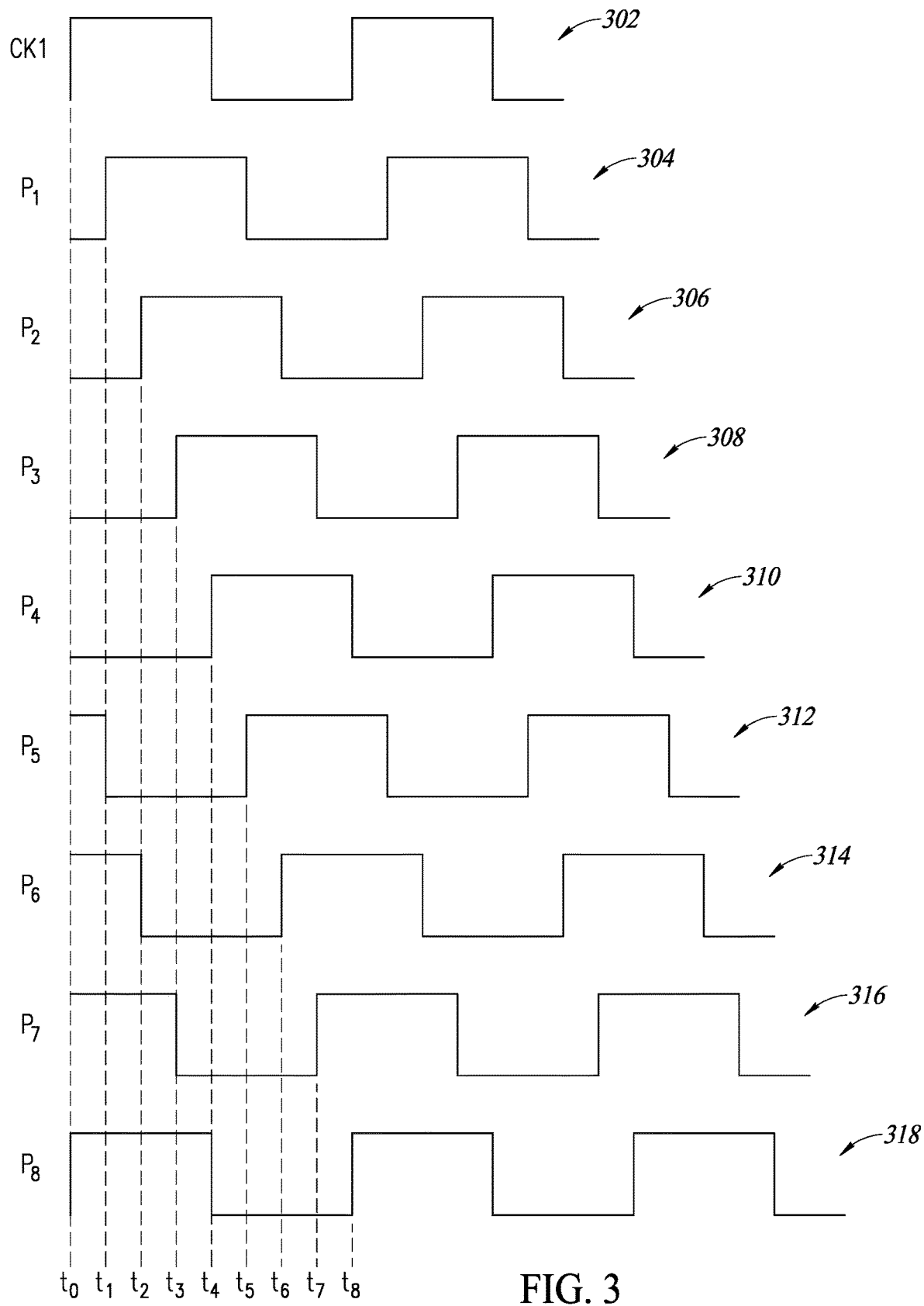
FIG. 3 includes graphs of various clock signals, in accordance with some embodiments.

FIG. 3 is a plurality of graphs 302-318, in accordance with some embodiments. The graph 302 illustrates the first clock signal CK1. The graph 304 illustrates the phase signal P1. The graph 306 illustrates the phase signal P2. The graph 308 illustrates the phase signal P3. The graph 310 illustrates the phase signal P4. The graph 312 illustrates the phase signal P5. The graph 314 illustrates the phase signal P6. The graph 316 illustrates the phase signal P7. The graph 318 illustrates the phase signal P8.

At time T0, the rising edge of the first clock signal CK1 occurs. At time t1, the rising edge of the phase signal P1 occurs. The time difference t2–t1 is approximately equal to T/8, where T is the period of the clock signal CK1. At T3, the rising edge of the phase signal P3 occurs. At t4, the rising edge of the phase signal P4 occurs. At t5, the rising edge of the phase signal P5 occurs. At t6, the rising edge of the phase signal P6 occurs. At t7, the rising edge of the phase signal P7 occurs. At t8, the rising edge of the phase signal P8 occurs. The rising edge of each of the phase signals is delayed by T/8 from the immediately preceding phase signal. The phase signal P8 may be substantially aligned with the first clock signal CK1.

Figure 4A:
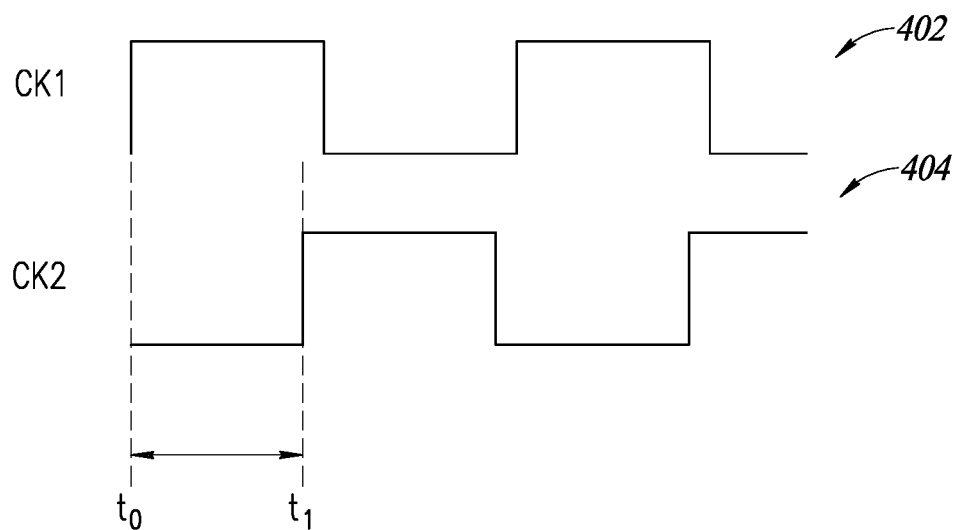
FIGS. 4A and 4B include graphs of various clock signals, in accordance with some embodiments.

FIG. 4A illustrates graphs of the first and second clock signals CK1 and CK2, in accordance with some embodiments. The graph 402 corresponds to the first clock signal CK1. The graph 404 corresponds to the second clock signal CK2. Due to variations in process, temperature, and voltage, the phase difference between CK1 and CK2 cannot be reliably anticipated. In the example of FIG. 4A, the rising edge of CK1 occurs at time t0 and the rising edge of CK2 occurs at time t1. While this may or may not be sufficient setup time, this generally will not be known beforehand. Accordingly, the phase selection process described previously can be performed.

Figure 4B:
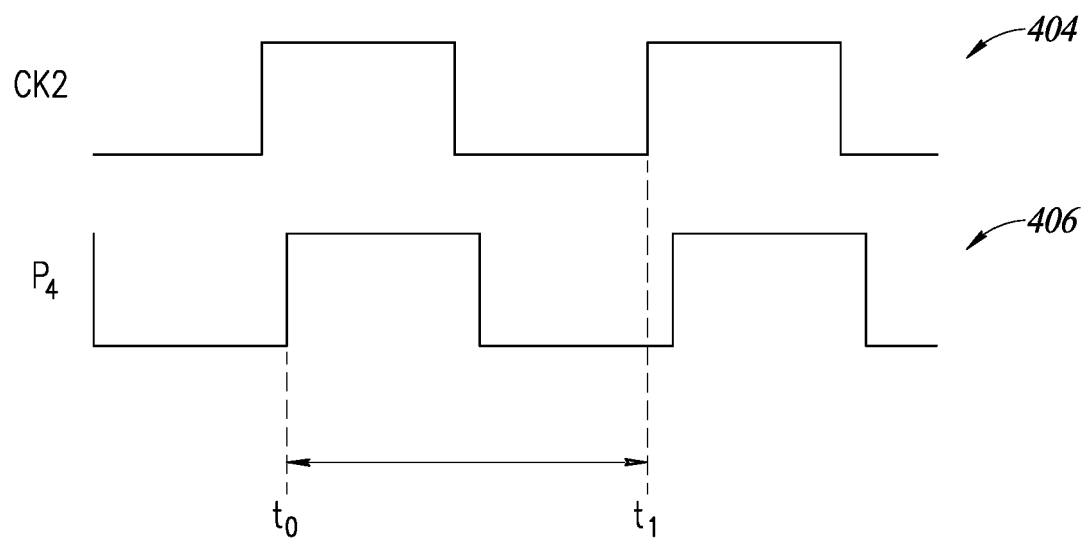

FIG. 4B illustrates the second clock signal CK2 and a selected phase signal, in accordance with some embodiments. The graph 404 corresponds to the second clock signal CK2. The graph 406 correspond to the selected phase signal P4. In FIG. 4B, a phase selection process has been performed and the phase signal P4 has been selected. This may indicate that the phase signal P3 (or P1 or P2) resulted in a set up failure. Because the phase signal P3 resulted in a set up failure, this is an indication that the rising edge of the phase signal P3 occurred immediately before the rising edge of the second clock signal CK2. Accordingly, the rising edge of the clock signal P4 is selected because it will occur immediately after the rising edge of the clock signal CK2. This is indicated in FIG. 4B in which the time that elapses from a rising edge of the phase signal P4 to the next rising edge of the second clock signal CK2 is nearly an entire clock cycle. Accordingly, selection of the phase signal P4 ensures that there will not be set up failures between the data output circuitry 106 and the data input circuitry 108.

Figure 5:
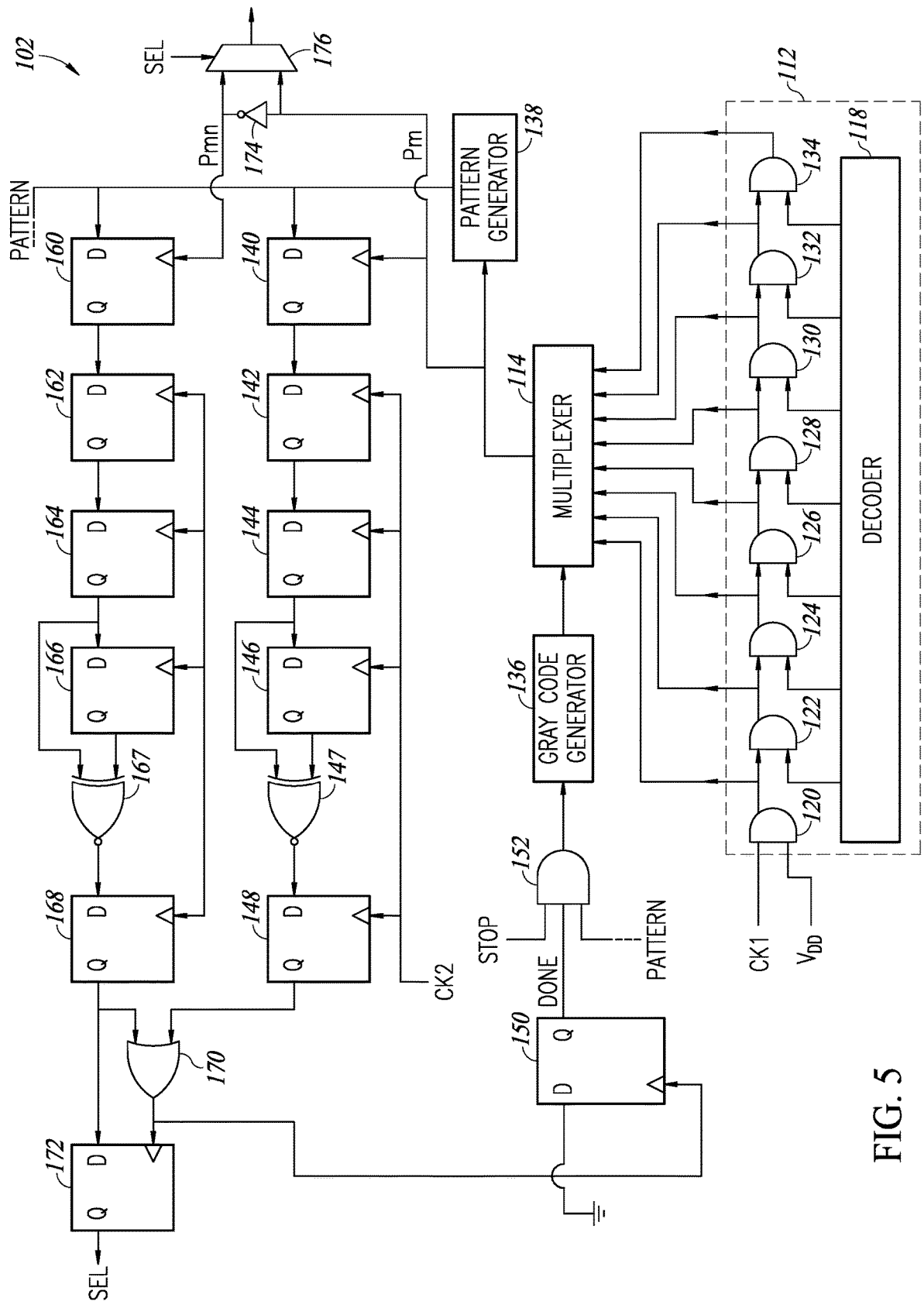
FIG. 5 is a schematic diagram of a first circuit block of an integrated circuit, in accordance with some embodiments.

FIG. 5 is a schematic diagram of a first circuit block 102, in accordance with some embodiments. The first circuit block 102 of FIG. 5 is similar to the first circuit block 102 of FIG. 2 in many ways. The first circuit block 102 of FIG. 5 differs from the first circuit block 102 of FIG. 2 in that the first circuit block 102 of FIG. 5 includes flip-flops 160, 162, 164, 166, an XNOR gate 167, and flip-flops 168 in parallel with the flip-flops 140-146, the XNOR gate 147, and the flip-flop 148.

The flip-flop 160 receives the logical complement Pmn of the phase signal Pm received by the flip-flop 140. This is due to the fact that the phase signal Pm is passed through an inverter 174 prior to arriving at the clock input terminal of the flip-flop 160. The inverter generates Pmn by inverting Pm. The flip-flops 162, 164, 166, and 168 receive the second clock signal CK2 on their clock input terminals. The XNOR gate 167 indicates when a set up failure occurs with the logical complement of Pm. Accordingly, the output of the flip-flop 168 indicates a set up failure with Pmn, while the output of the flip-flop 148 indicates set up failures with Pm.

An OR gate 170 has a first input coupled to the output of the flip-flop 168 and a second input coupled to the output of the flip-flop 148. The output of the OR gate 170 is provided to the flip-flop 150. The output of the OR gate 170 goes high if the output of either of the flip-flops 168 and 148 is high. Accordingly, a set up failure of either Pm or Pmn will result in the gray code generator 136 stopping.

A flip-flop 172 has a clock input terminal coupled to the output of the OR gate 170, a data input terminal coupled to the data output terminal of the flip-flop 168, and a data output terminal outputting a selection signal SEL. If the OR gate 170 goes high, then the value of the output of the flip-flop 168 is passed to the data output terminal of the flip-flop 172. Accordingly, SEL is high if the set up failure occurs with Pmn. SEL is low if the set up failure occurs with Pm.

A multiplexer 176 has a first input that receives a signal Pm and a second input that receives the signal Pmn. A control input receives the selection signal SEL. If SEL is high, then the multiplexer 176 outputs Pmn. If SEL is low, the multiplexer 176 outputs Pm. Accordingly, the circuit block 102 can select either Pm or Pmn to be provided to the data output circuitry 106.

Figure 6:
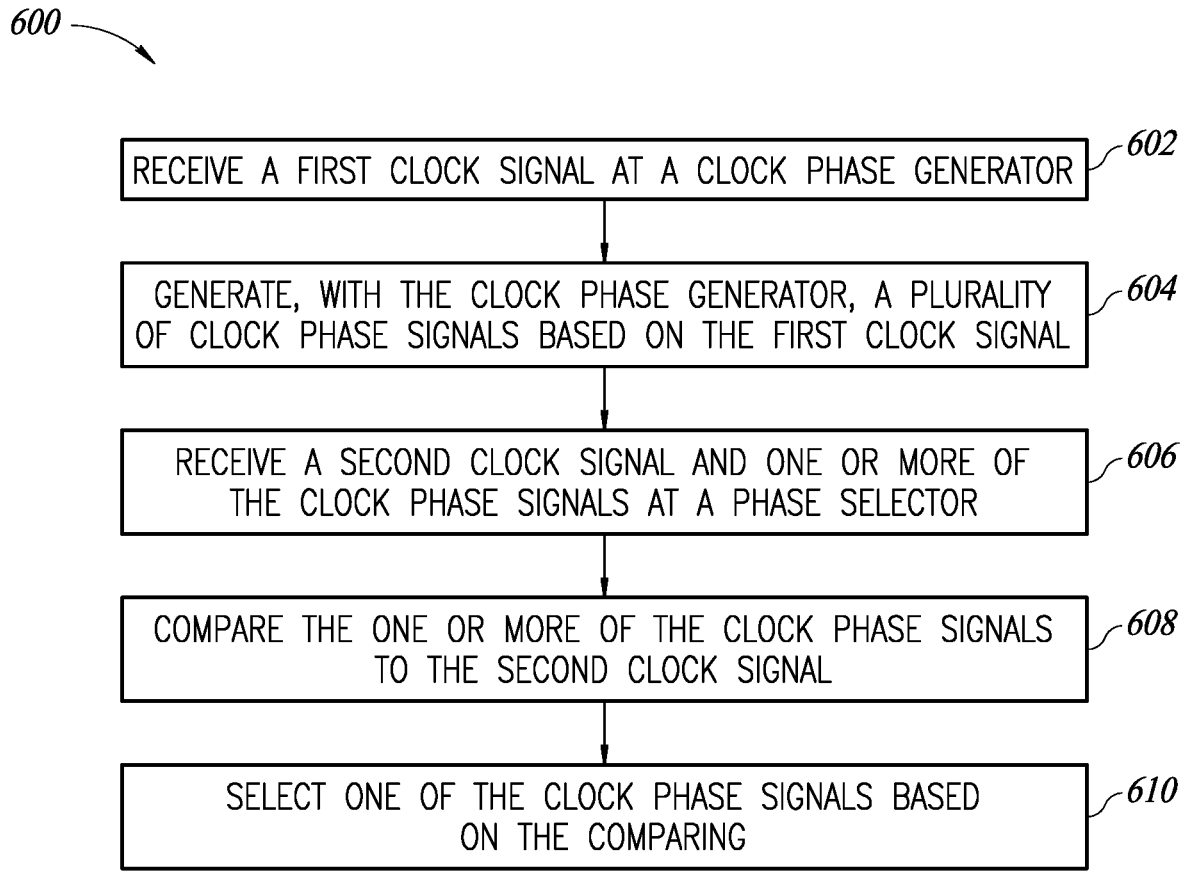
FIG. 6 is a flow diagram of a method for operating an integrated circuit, in accordance with some embodiments.

FIG. 6 is a flow diagram of a method 600 for operating an integrated circuit, in accordance with some embodiments. The method 600 can utilize components, systems, and processes described in relation to FIGS. 1-5. At 602, the method 600 includes receiving a first clock signal at a clock phase generator. At 604, the method 600 includes generating, with the clock phase generator, a plurality of clock phase signals based on the first clock signal. At 606, the method 600 includes receiving a second clock signal and one or more of the clock phase signals at a phase selector. At 608, the method 600 includes comparing the one or more of the clock phase signals to the second clock signal. At 610, the method 600 includes selecting one of the clock phase signals based on the comparing.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   a clock phase generator configured to receive a first clock signal and to output a plurality of phase signals;
   a phase selector configured to receive the plurality of phase signals and a second clock signal, to compare the phase signals to the second clock signal, and to select one of the phase signals based on the comparison;
   data output circuitry including:
      a first clock terminal configured to receive the selected phase signal; and
      a data output terminal configured to output data; and
   data input circuitry including:
      a first clock terminal configured to receive the second clock signal; and
      a data input terminal coupled to the data output terminal and configured to receive the data.

2. The integrated circuit of claim 1, further comprising a multiplexer coupled between the clock phase generator and the phase selector and configured to receive the clock phase signals from the clock phase generator and to output the clock phase signals to the phase selector one at a time.

3. The integrated circuit of claim 2, further comprising a gray code generator configured to supply a gray code to a control terminal of the multiplexer.

4. The integrated circuit of claim 1, wherein the phase selector is configured to output a control signal to a gray code generator.

5. The integrated circuit of claim 4, wherein the control signal causes the gray code generator to output a gray code while the phase selector is comparing the clock phase signals to the second clock signal.

6. The integrated circuit of claim 5, wherein the control signal causes the gray code generator to stop outputting the gray code after a phase signal generator has selected a phase signal.

7. The integrated circuit of claim 1, wherein the clock phase generator includes a plurality of AND gates connected in series.

8. The integrated circuit of claim 7, wherein a first AND gate of the plurality of AND gates receives the first clock signal, wherein each subsequent AND gate of the plurality of AND gates outputs a respective clock phase signal.

9. The integrated circuit of claim 1, further comprising:
   a first circuit block that operates in accordance with the first clock signal; and
   a second circuit block that operates in accordance with the second clock signal, wherein the first circuit block is configured to output data to the second circuit block in accordance with the selected clock phase signal.

10. The integrated circuit of claim 9, further comprising an analog-to-digital converter including the first circuit block and the second circuit block.

11. The integrated circuit of claim 10, wherein the first circuit block is an analog circuit block and the second circuit block is a digital circuit block.

12. A method, comprising:
   receiving a first clock signal at a clock phase generator;
   generating, with the clock phase generator, a plurality of clock phase signals based on the first clock signal;
   receiving a second clock signal and one or more of the clock phase signals at a phase selector;
   comparing the one or more of the clock phase signals to the second clock signal; and selecting one of the clock phase signals based on the comparison.

13. The method of claim 12, wherein comparing the one or more clock phase signals to the second clock signal includes:
providing the one or more of the clock phase signals sequentially to a clock input terminal of a first flip-flop; and
providing the second clock signal to a clock terminal of a second flip-flop connected in series with the first flip-flop; and
passing data from the first flip-flop to the second flip-flop.

14. The method of claim 13, wherein comparing the one or more clock phase signals to the second clock signal includes detecting a setup failure in the second flip-flop.

15. The method of claim 13, wherein comparing the one or more clock phase signals to the second clock signal includes providing the second clock signal to a clock input terminal of a third flip-flop coupled between the first and second flip-flops and in series with the first and second flip-flops.

16. The method of claim 15, wherein passing data includes passing a pattern of alternating 1s and 0s.

17. The method of claim 16, wherein comparing the one or more clock phase signals to the second clock phase signal includes comparing an output of the second flip-flop to the output of the third flip-flop.

18. The method of claim 17, wherein detecting a setup failure includes detecting that the output of the second flip-flop is the same as the output of the third flip-flop.

19. A device, comprising:
a first circuit block operated with a first clock signal; and
a second circuit block operated with a second clock signal, wherein the first circuit block includes:
a clock phase generator configured to receive the first clock signal and to output a plurality of phase signals based on the first clock signal; and
a phase selector configured to receive the plurality of phase signals and the second clock signal and to select one of the phase signals based on a comparison between the phase signals and the second clock signal.

20. The device of claim 19, wherein the second circuit block is a digital circuit block and the first circuit block is an analog circuit block.

21. The device of claim 19, wherein the second circuit block includes a first flip-flop having a clock input that receives the second clock signal, the first circuit block includes a second flip-flop having a clock input terminal that receives the selected phase signal.

22. The device of claim 21, wherein the second flip-flop includes a data output terminal and the first flip-flop includes a data input terminal coupled to the data output terminal of the first flip-flop.

23. The device of claim 19, wherein the phase signals are each a clock signal having a respective phase offset with respect to the first clock signal.

* * * * *